United States Patent
Jarvis et al.

(10) Patent No.: US 6,268,717 B1
(45) Date of Patent: Jul. 31, 2001

(54) SEMICONDUCTOR TEST STRUCTURE WITH INTENTIONAL PARTIAL DEFECTS AND METHOD OF USE

(75) Inventors: Richard W. Jarvis; Iraj Emami; Alan B. Berezin, all of Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/262,239

(22) Filed: Mar. 4, 1999

(51) Int. Cl.[7] .................................................. G01R 31/02
(52) U.S. Cl. ........................ 324/158.1; 324/765; 324/751
(58) Field of Search .................................. 324/500, 501, 324/751, 752, 750, 158.1, 765

(56) References Cited

U.S. PATENT DOCUMENTS

| | | |
|---|---|---|
| 3,751,647 | 8/1973 | Maeder et al. . |
| 3,842,491 | 10/1974 | Depuy et al. . |
| 3,983,479 | 9/1976 | Lee et al. . |
| 4,347,479 * | 8/1982 | Cullet ................................ 324/158.1 |
| 4,855,253 | 8/1989 | Weber . |
| 5,051,690 * | 9/1991 | Maly et al. ....................... 324/158.1 |
| 5,159,752 | 11/1992 | Mahant-Shetti et al. . |
| 5,514,974 | 5/1996 | Bouldin . |
| 5,576,223 | 11/1996 | Zeininger et al. . |
| 5,773,315 | 6/1998 | Jarvis . |
| 5,821,761 * | 10/1998 | Shida et al. ........................... 324/751 |
| 5,828,778 * | 10/1998 | Hage et al. ....................... 364/468.17 |
| 5,959,459 | 9/1999 | Satya et al. . |
| 6,016,062 * | 1/2000 | Nicollian et al. .................... 324/769 |

OTHER PUBLICATIONS

Hess et al., "A Digital Tester Based Measurement Methodology for Process Control in Multilevel Metallization Systems," *Proc. SPIE's 1995 Microelectronic Manufacturing Conference*, vol. 2637, Oct. 1995.

Hess et al., "Control of Application Specific Interconnection on Gate Arrays Using an Active Checkerboard Test Structure," *Proc. IEEE 1996 Int. Conference on Microelectronic Test Structures*, vol. 9, Mar. 1996.

Hess et al., "Correlation Between Particle Defects and Electrical Faults Determined with Lser Scattering Systems and Digital Measurements on Checkerboard Test Structures," *Proc. SPIE's 1996 Microelectronic Manufacturing Conference*, vol. 2874, Oct. 1996.

Hess et al., "Issues on the Size and Outline of Killer Defects and their Influence on Yield Modeling," *Proc. IEEE/SEMI 1996 Advanced Semiconductor Manufacturing Conference*, vol. 7, Nov. 1996.

(List continued on next page.)

Primary Examiner—Safet Metjahic
Assistant Examiner—Jimmy Nguyen
(74) Attorney, Agent, or Firm—Kevin L. Daffer; Conley, Rose & Tayon P.C.

(57) ABSTRACT

A test structure which includes alternating grounded and floating conductive lines may be used to test the formation of conductive features on an integrated circuit topography. A number of intentional partial defects may be formed at predetermined locations along the test structure. During irradiation of the conductive lines from an electron source, the grounded conductive lines will appear darker than the floating conductive lines. If a short occurs between the conductive lines, due to an extra material defect, the portion of the floating line in the vicinity of the defect will also appear darkened. If an open appears along a grounded line, the non-grounded portion of the grounded line will be glowing. The grounded conductive lines are preferably grounded through a depletion-mode transistor. By applying a voltage to the transistor, the grounded line may be disconnected from ground, allowing electrical testing of the test structure.

20 Claims, 7 Drawing Sheets

OTHER PUBLICATIONS

Hess et al., "Determination of Defect Size Distributions Based on Electrical Measurements of a Novel Harp Test Structure," *Proc. IEEE 1997 Int. Conference on Microelectronic Test Structures,* vol. 10, Mar. 1997.

Hess et al., "Issues on Short Circuits in Large On–Chip Power MOS–Transistors Using a Modified Checkerboard Test Structure," *Proc. IEEE 1997 Int. Conference on Microelectronic Test Structures,* vol. 10, Mar. 1997.

Hess et al., "Customized Checkerboard Test Structures to Localize Interconnection Point Defects," *Proc. 1997 VLSI Multilevel Interconnection Conference,* vol. 14, Jun. 1997.

Hess et al., "Comparison of Defect Size Distributions Based on Electrical and Optical Measurement Procedures," Proc. IEEE/SEMI 1997 Advanced Semiconductor Manufacturing Conference, vol. 8, Sep. 1997.

Hess et al., "Defect Cluster Analysis to Detect Equipment Specific Yield Loss Based on Yield–to–Area Calculations," *Proc. SPIE's 1997 Microelectronic Manufacturing Conference,* vol. 3216, Oct. 1997.

Hess et al., "Strategy to Disentangle Multiple Faults to Identify Random Defects within Test Structures," *Proc. IEEE 1998 Int. Conference on Microelectronic Test Structures,* vol. 11, Mar. 1998.

Hess et al., "Wafer Level Defect Density Distribution Using Checkerboard Test Structures," *Proc. IEEE 1988 Int. Conference on Microlectronic Test Structures,* vol. 11, Mar. 1998.

Hess et al., "Novel Methodology to Include all Measured Extension Values per Defect to Improve Defect Size Distributions," *Proc. IEEE/SEMI 1998 Advanced Semiconductor Manufacturing Conference,* vol. 9, Sep. 1998.

Hess et al., "Modeling of Real Defect Outlines for Defect Size Distribution and Yield Prediction," *Proc. IEEE 1993 Int. Conference on Microeloectronic Test Structures,* vol. 6, Mar. 1993.

Hess et al., "Drop In Process Control Checkerboard Test Structure for Efficient Online Process Characterization and Defect Problem Debugging," *Proc. IEEE 1994 Int. Conference on Microelectronic Test Structures,* vol. 7, Mar. 1994.

Hess et al., "Modeling of Test Structures for Efficient Online Defect Monitoring Using a Digital Tester," *Proc. IEEE 1994 Int. Conference on Microelectronic Test Structures,* vol. 7, Mar. 1994.

Hess, "Strategy to Optimize the Development, Use, and Dimension of Test Structures to control Defect Apperance in Backend Process Steps," *Proc. IEEE/SEMI 1994 Advanced Semiconductor Manufacturing Conference,* vol. 5, Nov. 1994.

Hess et al., "Defect Parameter Extraction in Backend Process Steps Using a Multilayer Checkerboard Test Structure," *Proc. IEEE 1995 Int. Conference on Microelectronic Test Structures,* vol. 8, Mar. 1995.

Hess et al., "Influence of Short Circuits on Data of Contact & Via Open Circuits Determined by a Novel Weave Test Structure," *Proc. IEEE 1995 Int. Conference on Microelectronic Test Structures,* vol. 8, Mar. 1995.

Hess et al., "Resistance Modeling of Test Structures for Accurate Fault Detection in Backend Process Steps Using a Digital Tester," *Proc. IEEE 1995 Int. Conference on Microelectronic Test Structures,* vol. 8, Mar. 1995.

1995 Microelectronic Manufactturing, vol. 2637, Oct. 1995.*

* cited by examiner

US 6,268,717 B1

SEMICONDUCTOR TEST STRUCTURE WITH INTENTIONAL PARTIAL DEFECTS AND METHOD OF USE

BACKGROUND OF THE INVENTION

1. Field of the Invention

This invention relates to semiconductor fabrication and more particularly to a test structure for testing the accuracy of formation of conductive structures using both visual and electronic inspection techniques.

2. Description of the Relevant Art

High yields are essential to the profitable manufacture of integrated circuits. Yield prediction, used to estimate the manufacturing yield of a new integrated circuit, is accordingly a very valuable tool in assuring that such manufacture will be economically successful.

A wafer fabrication process typically forms multiple integrated circuits upon each of several silicon wafers processed simultaneously. As the integrated circuits formed on a given silicon wafer are identical copies of a given product, the silicon wafer is sometimes referred to as a product wafer. An individual integrated circuit is also called a "chip" or a "die". Following wafer fabrication, the die are subjected to functional testing, then separated. Fully functional die are typically packaged and sold as individual units.

In general, the yield associated with a product wafer manufactured using a particular wafer fabrication process depends upon: 1) the number of steps in the wafer fabrication process, 2) the number of defects introduced during each processing step, and 3) the vulnerability of the features formed during a given processing step to the defects introduced during the processing step.

A defect is simply a flaw caused by an imperfect manufacturing process. Only some of the defects associated with a given step are "full" defects, or defects which prevent an integrated circuit containing the defect from performing its intended function. It is well known that most defects occur during microstructure patterning steps. Photolithography is used to accomplish such patterning steps, during which light passing through a pattern on a mask transfers the pattern to a layer of a light-sensitive material deposited on the surface of a silicon wafer. The layer of the light-sensitive material is developed in a manner analogous to the developing of exposed photographic film. Exposure to light makes certain regions of the layer of light-sensitive material soluble. The developing step removes the soluble regions, forming holes in the layer of light-sensitive material. Select regions of the upper surface of the silicon wafer are exposed to an etchant or to dopant atoms through the holes during a subsequent processing step. Small particles (i.e., particulates) on the surface of the mask or on the surface of the photoresist layer, which block or diffuse light, cause imperfect pattern registrations (i.e., imperfect feature formations). Particulates may be present in the ambient air, introduced by processing personnel, suspended in liquids and gases used during processing, or generated by processing equipment. In general, the vulnerability of a particular feature to a given defect is inversely proportional to the physical dimensions of the feature. Thus the smaller the physical dimensions of a feature formed using photolithography, the greater the likelihood that a particulate of a given size will cause a full defect.

There are two basic types of defects which may occur when conductive layers are formed on an integrated circuit topography. Extra material defects ("EMDs") may occur when the conductive structures include material extending beyond the predefined boundaries. Such material may extend to another conductive structure causing a "short" to be formed between the two conductive structures. Missing material defects ("MMDs") may occur when a conductive structure is formed which is missing some of its conductive material. Such a defect may cause the formation of an "open" conductive structure in which the continuity of a conductive structure is broken.

EMDs and MMDs may be detected using test structures. Typically, these test structures include a number of electrically testable conductive lines. Electrical probing of these conductive lines may be used to determine the presence of shorts between two or more conductive lines or the presence of opens in a conductive line. FIG. 1A depicts a typical test structure used to test for EMDs. The test structure includes a first conductive comb 10 with a test pad 12 and a second conductive comb 20 with a test pad 22. The combs are formed in close proximity to each other. If no EMDs are present, electrical probing of pads 12 and 22 will show no electrical connection (e.g., high resistance). If, however, a conductive EMD 30 having a sufficient size to bridge at least two of the conductive lines is present, as depicted in FIG. 1B, a short may be formed between the two conductive lines, thus allowing an electrical connection to be formed. When pads 12 and 22 are simultaneously probed, an electrical connection (e.g., a low resistance) may be detected.

FIG. 2A depicts a serpentine structure which may be used to test for MMDs in a conductive structure. The test structure includes a serpentine conductive line 40 with test pads 42 and 44 formed at both ends of the line. If no MMDs are present, electrical probing of pads 42 and 44 should show conductivity between the two pads. If, however, an MMD 50 is present, as depicted in FIG. 2B, sufficient material may be absent such that the connectivity of the conductive line is broken. This MMD may be detected when electrical probing of the pads reveals a decrease in conductivity between the pads.

A disadvantage of these types of test structures is that every line has to be individually probed to check for these defects. If a large number of test structures are present, the electrical testing of each of these test structures may take an undesirable length of time. It would be desirable to develop a test structure and method which can more rapidly determine the presence of defects. Such a structure and method would be beneficial in rapidly detecting the presence of unacceptable defects during a production run.

Another disadvantage of a conventional test structure is that the tolerance of the test structure with respect to partial defects may be difficult to assess. The above described test structure may be used to determine the presence of full or "absolute" defects which cause a complete open or short of a conductor within the test structure. However, the cause of such defects may be harder to determine. For example, EMDs are typically determined when a short is detected between adjacent conductive lines. When such a defect is found, it may be difficult to determine the dimensions of the particle which caused the defect to occur. As described above, small particles on the surface of the mask or on the surface of the photoresist layer, which block or diffuse light, may cause imperfect pattern registrations (i.e., imperfect feature formations). However, the size of the defect may not correspond to what would be expected based on the size of the particle on the mask or photoresist layer. For example, a particle which bridges only 50% of the space between the conductive lines may, ultimately, cause a full defect, i.e., a defect that causes a short between the conductive lines. The initial defect may be "expanded" due to poor resolution in subsequent photoresist and conductive feature processing steps. Alternatively, the partially extended defects may expand over time through electromigration. Thus, the presence of defects in a test structure may be erroneously attributed to large particles, when, in fact, smaller particles are actually causing the problems. This may lead to difficulties in isolating and preventing the formation of such defects. For example, if it is determined that the particle causing a defect has an expected size, which is based on the size of the defect, and which is larger than the actual size of the particle, filtering techniques to remove such particles may be inadequate. It is therefore desirable that a more accurate method of determining the tolerance of conductive features toward partial defects be devised.

It is also desirable to have a test structure which may be used in a process to validate inspection tools. As described above, electrical testing can be a time consuming process. Other types of inspection, i.e., optical and voltage contrast inspections, may be performed more rapidly than electrical testing. However, such inspection techniques may not be able to detect smaller defects, which would be found by electrical testing techniques. It is therefore desirable to have a test structure designed for use in testing the ability of optical and/or voltage contrast inspection tools to find defects.

SUMMARY OF THE INVENTION

The problems outlined above are in large part solved by a test structure which includes at least one partial EMD and at least one partial MMD, formed at predetermined locations on the test structure. These defects are formed having a predetermined size, as well as location, so that the tolerance of conductive lines toward partial defects may be better assessed. A partial EMD is a defect which is designed to partially extend between two conductive lines, contacting only one of the conductive lines. A partial MMD is a defect which is designed to form a slot, devoid of conductive material, which partially extends across a conductive line. By forming these intentional defects at known locations of the test structure, the tolerance of the conductive lines toward partial defects may be determined. After forming a test structure which includes partial defects, optical and electrical scanning of the test structure may be used to determine the presence of full defects. Since the location of all of the partial defects is predetermined, a rapid scan of only a portion of the test structure may be used to determine which of the intentional partial defects causes a full defect to be formed during the formation of conductive lines.

In an embodiment, a test structure may be formed on an integrated circuit topography. The integrated circuit topography may include the semiconductor substrate or any layer formed upon the semiconductor substrate. The test structure is used to test the tolerance of conductive lines toward partial defects formed therein. The test structure may also be used to assess the ability of an inspection tool to find defects. At least one, preferably more, partial EMDs are formed on a first conductive line. At least one, preferably more, partial MMDs are formed on a second conductive line. The first conductive line is preferably coupled to ground, while the second conductive line is preferably substantially ungrounded, i.e., allowed to "float" between power and ground. The use of alternating grounded and ungrounded lines allows for a rapid voltage contrast inspection of the test structure to determine if full defects are present. The term full defect refers to a defect which causes a short between two adjacent conductive lines or an open in a conductive line. When the test structure is irradiated with electrons, conductive lines which are floating (i.e., non-grounded) will emit more electrons than grounded conductors. This occurs because the grounded conductors absorb a portion of the electrons directed toward them, thus emitting fewer electrons than the floating conductive lines. If a defect is present which causes a short between a grounded and an ungrounded line, the two lines will emit about the same amount of electrons. During an inspection of the test structure, the lines should appear as an alternating series of glowing (i.e., reflecting more electrons) and darkened (i.e., reflecting fewer electrons) conductive lines. If a full defect is present on the test structure, this condition may be detected by inspecting the test structure while the structure is being irradiated with electrons. If a floating and grounded line are shorted to each other, the floating line in the vicinity of the defect will appear to be darkened, thus readily signaling the presence of a full defect.

An advantage of this test structure is that the presence and location of the full defect may be readily determined. If a short occurs between a floating and a grounded line, the floating line will appear darkened in the vicinity of the short. Thus, when the region in which the defect is present is inspected a change in the visual appearance of a conductive line will occur. This method allows not only the detection of EMDs, but also allows a rapid method of determining the location of the defect. Optical inspection methods require scanning of the entire test structure at a resolution that allows optical detection of the defect. Voltage contrast inspection allows a much coarser scan since a much larger area of the test structure will appear altered due to the presence of a defect.

Another advantage of forming partial defects at known locations within the test structure is that the ability of an inspection tool to detect small and/or low contrast defects may be determined. Small defects are defects which are difficult to observe using standard voltage contrast inspections and/or optical inspections. Low contrast defects are defects which may cause changes which are hard to detect due to very low contrast between the defect and the non-defective conductive line. Both small defects and low contrast defects may be difficult to observe during voltage contrast and/or optical inspections. Thus, the defects may be missed. By producing known partial defects within a test structure the ability of an inspection tool to find the partial defects may be determined.

A transistor may be coupled to the first conductive line such that the transistor couples the first conductive line to the ground. The transistor is preferably a depletion-mode transistor. When a voltage is applied to the transistor, the transistor is configured to disconnect the first conductive line from the ground, thus rendering the first conductive line floating. The transistor may be coupled to a pad. The pad is preferably configured such that a voltage applied to the pad causes the transistor to disconnect the first conductive line from ground. An advantage of placing a transistor between the conductive line and the ground is that the line can be switched from a grounded to floating state. This allows the test structure to be used for a variety of testing techniques, including non-grounded electrical testing. Examples of test methods with which the above described test structure may be used include, but are not limited to, voltage contrast inspectability, optical inspection, basic particle size distribution, grounded electrical testing, and non-grounded electrical testing.

The first conductive line is preferably formed in a comb-like structure. The first conductive line preferably includes a main body portion with projections extending from the main body portion. The second conductive line is preferably routed in a serpentine fashion around the projections of the first conductive line. The second conductive line may be positioned such that a distance between the first and second conductive lines is constant.

The test structure may also include additional conductive lines. A third conductive line may be formed which includes at least one, preferably more, partial MMDs. A fourth conductive line may be formed which includes at least one, preferably more, partial EMDs. The third conductive line is preferably coupled to ground through a transistor. The transistor is preferably a depletion-mode transistor. When a voltage is applied to the transistor, the transistor is configured to disconnect the third conductive line from the ground, thus rendering the third conductive line floating. The fourth conductive line is preferably a floating line.

When four conductive lines are incorporated into the test structure, two of the lines, preferably the first and the fourth conductive lines, are comb-like lines. Both the first and fourth lines include projections extending out from a main portion of the conductive lines. The projections extend toward and away from the opposing conductive line. Sandwiched between the comb like first and fourth lines, the second and third conductive lines are routed in serpentine fashion between the projections of the first and fourth lines. Preferably, the spacing between all of the lines is substantially constant such that at any given point the distance between neighboring lines is substantially the same. The use of comb like and serpentine lines allows a greater surface area of the integrated circuit topography to be covered while maintaining a minimal number of conductive lines.

The dimensions of the partial defects may be varied to allow testing of various types of partial defects. Partial EMDs are preferably formed which extend across up to about 80% of the gap between two adjacent conductive lines. Partial MMDs are preferably formed such that the defects extend across up to about 80 % of the conductive line. The width of the partial defects is preferably about equal to the width of the conductive feature. The conductive lines are preferably formed from a conductive material during the formation of conductive features on other parts of the integrated circuit topography. Examples of conductive materials include, but are not limited to, conductive metals, such as aluminum, titanium, cobalt, etc., and silicided polysilicon.

In another embodiment, testing pads may be incorporated into the test structure. The test pads are attached to each of the conductive lines to allow electrical testing of the conductive lines. The test pads are preferably connected to the conductive lines to allow testing of shorts between the lines and to find opens in the conductive lines. The pads are preferably placed at opposed ends of a conductive line to allow testing of the continuity of the entire conductive line.

The above described test structure may be used to test for defects which may occur during the formation of conductive features on an integrated circuit topography. Typically, the test structure is formed substantially simultaneously with the formation of conductive features on production chips. Alternatively, the test structure may be formed on an entire wafer using the same processing conditions which are used for production wafers. The test structure may be used to study the accuracy of the processing steps used for the formation of the conductive features.

After formation of the test structure, the structure is irradiated with electrons. The floating lines will emit electrons and will thus appear to "glow". The grounded conductive lines, however, will absorb a portion of the irradiated electrons, and thus emit fewer electrons than the floating lines. During irradiation of the test structure, the test structure may be inspected to determine if the conductive lines are glowing or darkened. If no defect is present, a pattern of glowing and darkened lines will be seen. If a defect is present, the defect may span the space between a floating line and a grounded line, causing the floating line to become grounded. In this case, instead of glowing, a portion of the conductive line, near to the short, will now be darkened.

MMDs in the grounded conductive line may also be found using a voltage contrast inspection method. If a defect is present on a conductive line which is grounded, such that the continuity of the conductive line is broken, a portion of the conductive line will now be floating. During a voltage contrast inspection, while the test structure is irradiated with electrons, the floating portion of the conductive line will glow, while the grounded portion of the conductive line will be darkened. By inspecting a portion of the test structure near the point of grounding, and a portion of the test structure farther away from the point of grounding, an open in a grounded conductive line may be detected. The inspected portions may represent only a fraction of the total area of the test structure. This offers an advantage over conventional optical inspections which may require scanning the entire test structure to determine the presence of opens in a conductive line. By minimizing the area required for scanning, the test structure may be used to quickly validate a process step involving the formation of conductive features.

When defects are detected in a test structure using an optical or voltage contrast inspection, the presence of defects may be electrically verified. By incorporating test pads into the structure, the presence of EMDs and MMDs may be detected electrically. EMDs may be detected by electrically testing for connectivity between the conductive lines of the test structure. MMDs may be detected by testing for continuity of a conductive line. The grounded conductive lines, as described above, may also include a transistor which is configured to disconnect the grounded lines from the ground when a voltage is applied to the transistor. The use of transistors allows both grounded and non-grounded electrical testing method to be performed.

After a defect is detected, the test structure may be inspected at the locations where the intentional partial defects are formed. By inspecting these regions, the type of partial defects which caused the full defect to occur may be determined. When no intentional defects are created, the defect investigator typically must search for randomly formed partial defects of the proper size and placement to determine the tolerance of conductive lines toward partial defects. Since the random defects are neither predictable or reproducible, a method that relies on finding random defects would not be statistically valid. By intentionally creating partial defects in the test structure, at predetermined locations, more statistically significant data may be obtained concerning the effect of partial defects on the formation of non-defective conductive features.

BRIEF DESCRIPTION OF THE DRAWINGS

Other objects and advantages of the invention will become apparent upon reading the following detailed description and upon reference to the accompanying drawings in which.

Figure 1A:
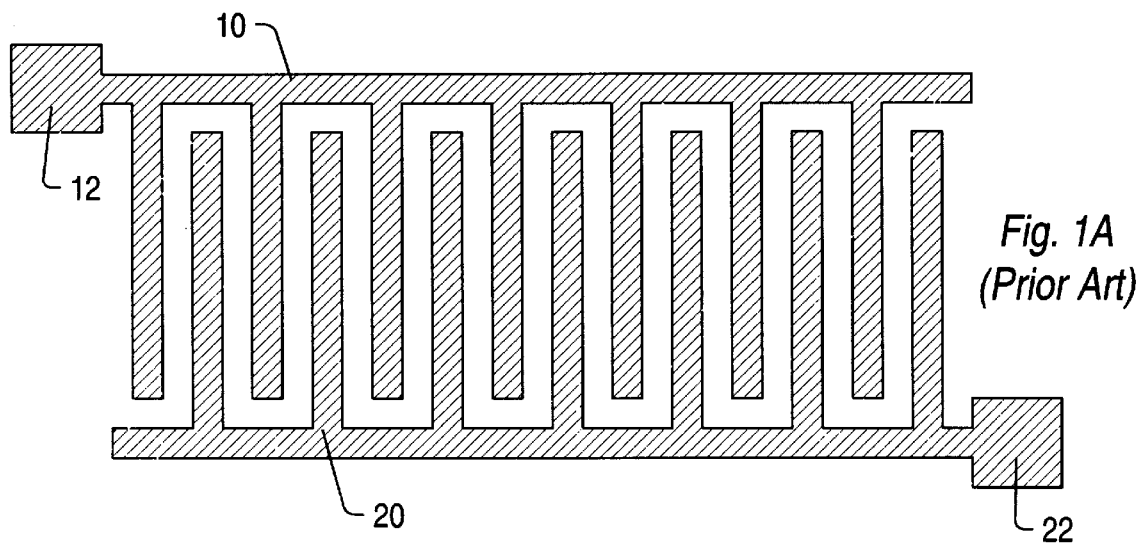
FIGS. 1A and 1B depict a top view of a prior art test structure for determining the presence of EMDs.
Figure 1B:
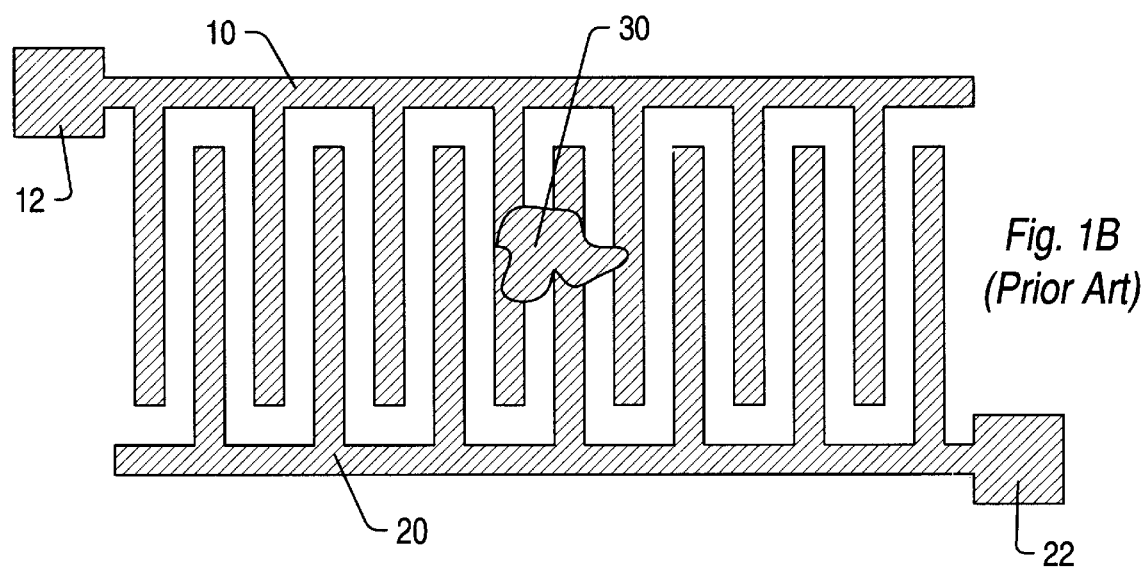
Figure 2A:
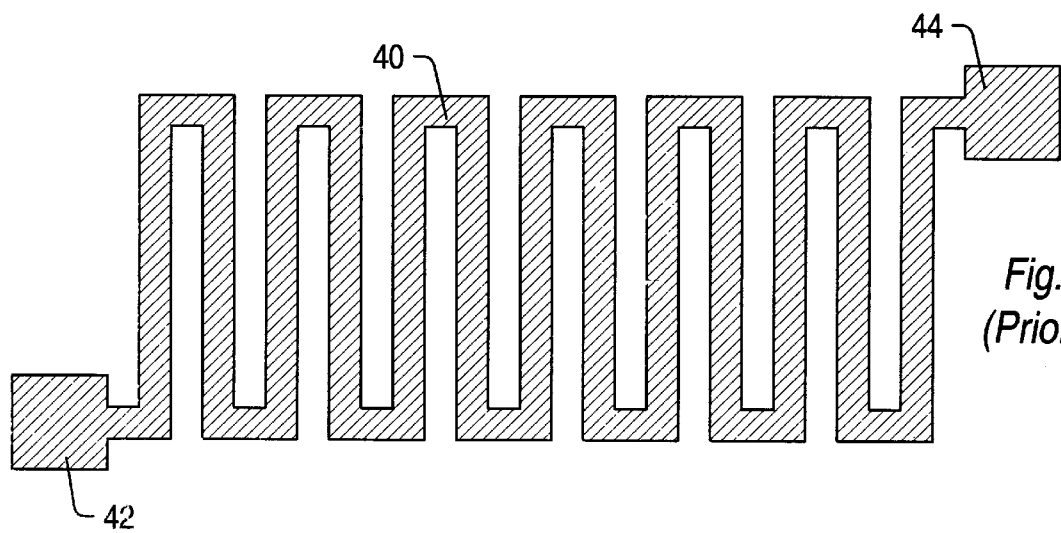
FIGS. 2A and 2B depict a top view of a prior art test structure for determining the presence of MMDs.
Figure 2B:
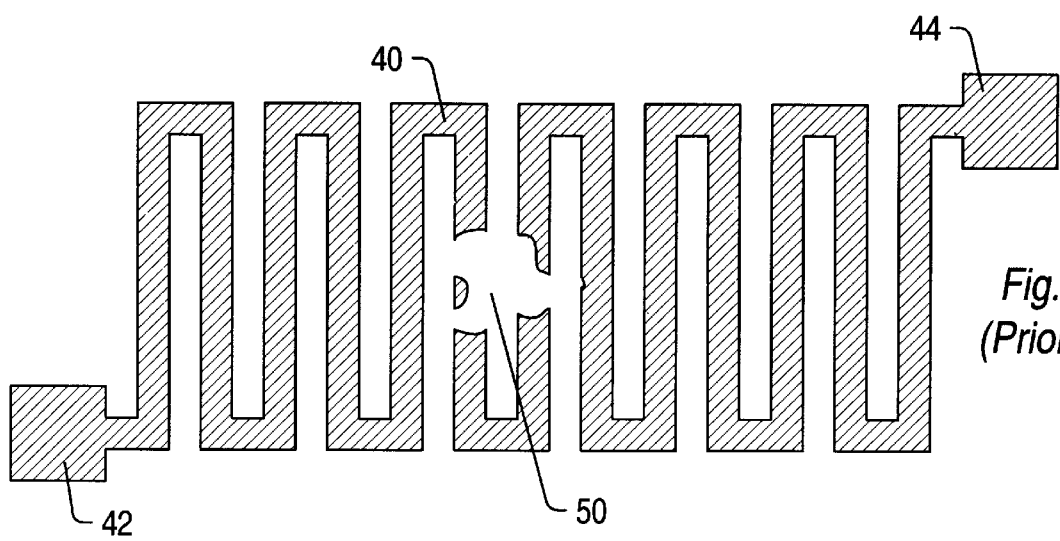

While the invention is susceptible to various modifications and alternative forms, specific embodiments thereof are shown by way of example in the drawing and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Figure 3:
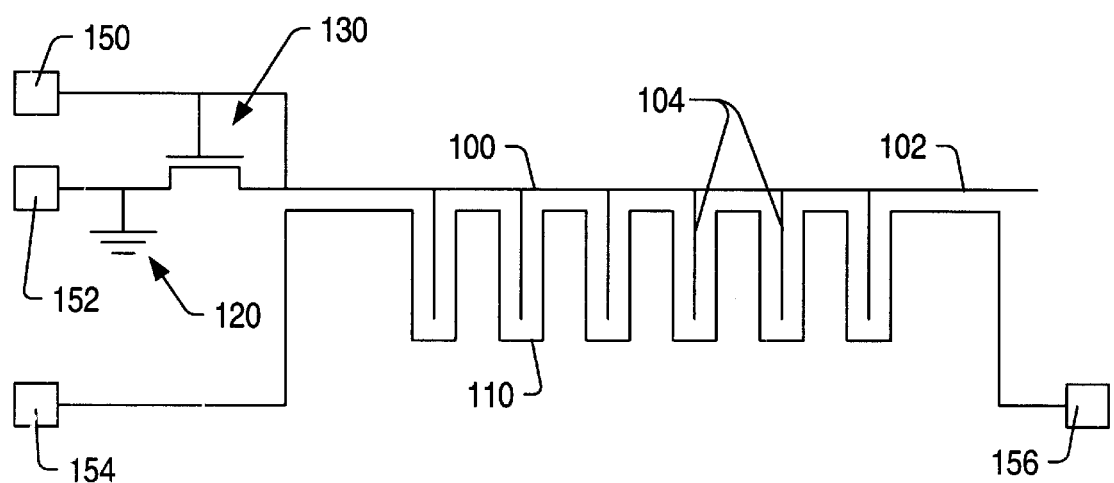
FIG. 3 depicts a schematic view of a test structure which include two conductive lines.

A schematic diagram of a test structure which includes at least two conductive lines is depicted in FIG. 3. The first conductive line 100 is coupled to ground 120. First conductive line 100 preferably includes a main portion 102 with projections 104 extending from the main portion. These projections 104 give first conductive line 100 a comb like appearance. The second conductive line 110 is non-grounded, i.e., floating. The second conductive line is preferably routed in a serpentine fashion around the projections 104 and along the main portion 102 of the first conductive line. The second conductive line may be positioned such that a distance between the first and second conductive lines is substantially constant. The widths of the conductive lines, as well as the spacing between them, are preferably selected to correspond to the linewidths and separation between conductive lines that may be formed in production regions of a wafer. As used in this application, "production region" describes a region of a wafer that is designed to be a part of an operable integrated circuit intended to function as part of an electronic device. Both the first and second conductive lines are formed on an integrated circuit topography. The conductive lines are preferably formed from either a conductive metal, e.g., aluminum, titanium, etc., or silicided polysilicon.

Figure 4:
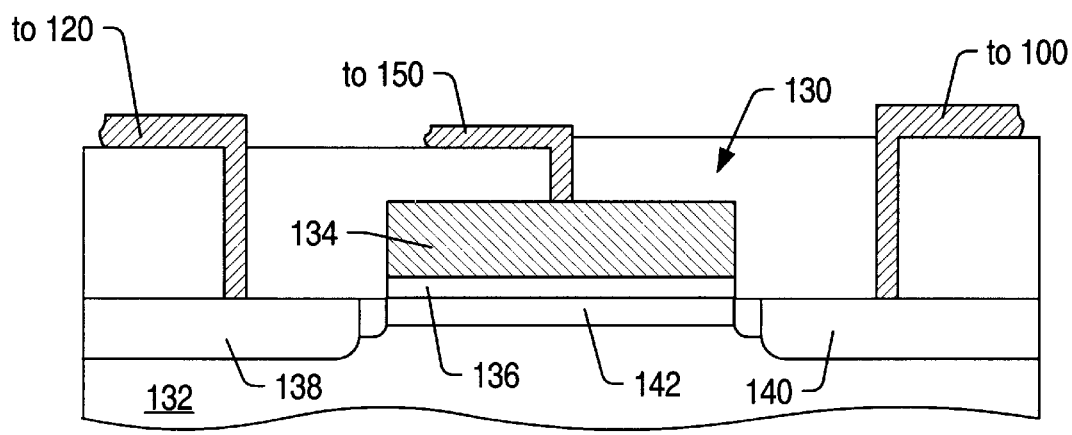
FIG. 4 depicts a cross sectional view of a depletion-mode transistor coupled to a conductive line.
Figure 5A:
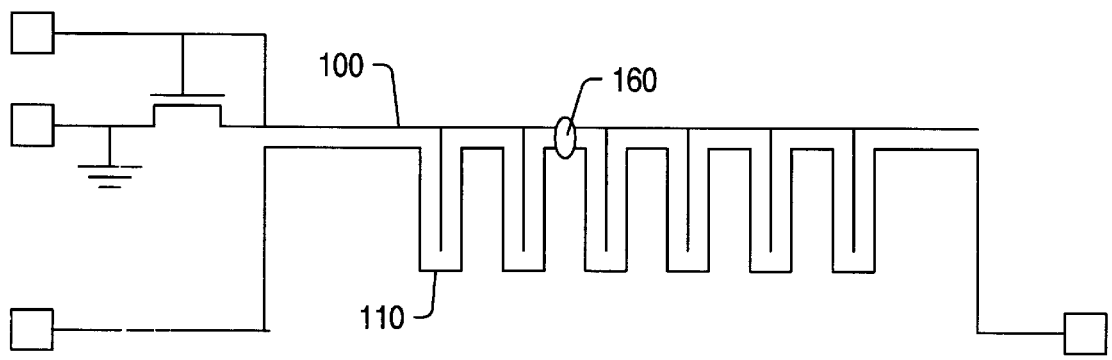
FIG. 5A depicts a schematic view of a test structure which includes two conductive lines, wherein an EMD causes a short between the conductive lines.
Figure 5B:
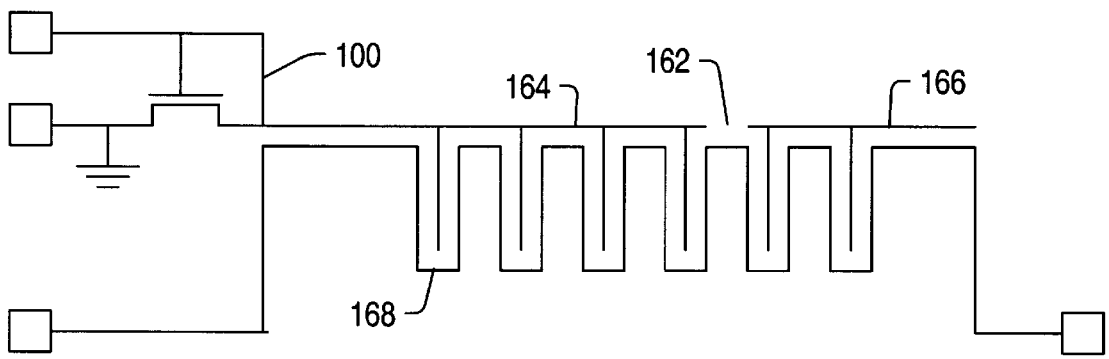
FIG. 5B depicts a schematic view of a test structure which includes two conductive lines, wherein an MMD causes an open in one of the conductive lines.

A transistor 130 may be coupled to first conductive line 100 such that the transistor couples the first conductive line to ground 120. Transistor 130 is preferably a depletion-mode MOSFET transistor. An n-channel depletion-mode MOSFET or a p-channel depletion-mode MOSFET may be used. FIG. 4 depicts a partial cross-sectional view of an integrated circuit topography upon which a depletion-mode MOSFET is formed. The depletion-mode MOSFET includes a gate conductor 134, a gate dielectric 136, a source region 138, a drain region 140, and a channel region 142. The channel region 142 is diffused between the source and the drain, with the same type of impurity as used for the source/drain diffusion. Source region 138 is coupled to ground 120, drain region 140 is coupled to the first conductive line 100, and the gate 134 is coupled to a pad 150 configured to receive an electrical probe. When the gate to source voltage is zero (i.e., $V_{gs}=0$), the source and drain regions are connected via the channel region, thus coupling the first conductive line to ground 120. If the gate to source voltage is increased, i.e., made negative for an n-channel transistor or positive for a p-channel transistor, the channel region will become less conductive. The gate to source cutoff voltage is defined as the voltage at which the current between the source and drain is reduced to a negligible value. Thus, by applying a voltage to the gate of the transistor equal to or greater than the gate to source cutoff voltage, the first conductive line 100 may be disconnected from ground 120. By disconnecting first conductive line 100 from ground 120, the first conductive line will become a floating line.

The transistor may be coupled to a pad 150. Pad 150 is configured to receive an electrical probe. An electrical probe may be used to apply a voltage which is sufficient to cause the transistor to disconnect the first conductive line from ground 120. An advantage of placing a depletion-mode transistor between the conductive line and the ground is that the conductive line may be switched from a grounded to floating state. By switching the line from grounded to floating state, electrical inspections may be performed. This allows the test structure to be used for a variety of testing methods. Examples of test methods with which the above-described test structure may be used include, but are not limited to, voltage contrast inspection, optical inspection basic particle size distribution, grounded electrical testing, and non-grounded electrical testing.

The above-described test structure may be used in a voltage contrast inspection tools or optical inspection tools to test for defects which may have occurred during the formation of conductive features on an integrated circuit topography. The test structure is preferably formed on a test area of an integrated circuit topography using the same process steps as used on a production die area of the wafer. In this manner, process induced defects produced in the production die areas may be duplicated in the test structure area.

Figure 6:
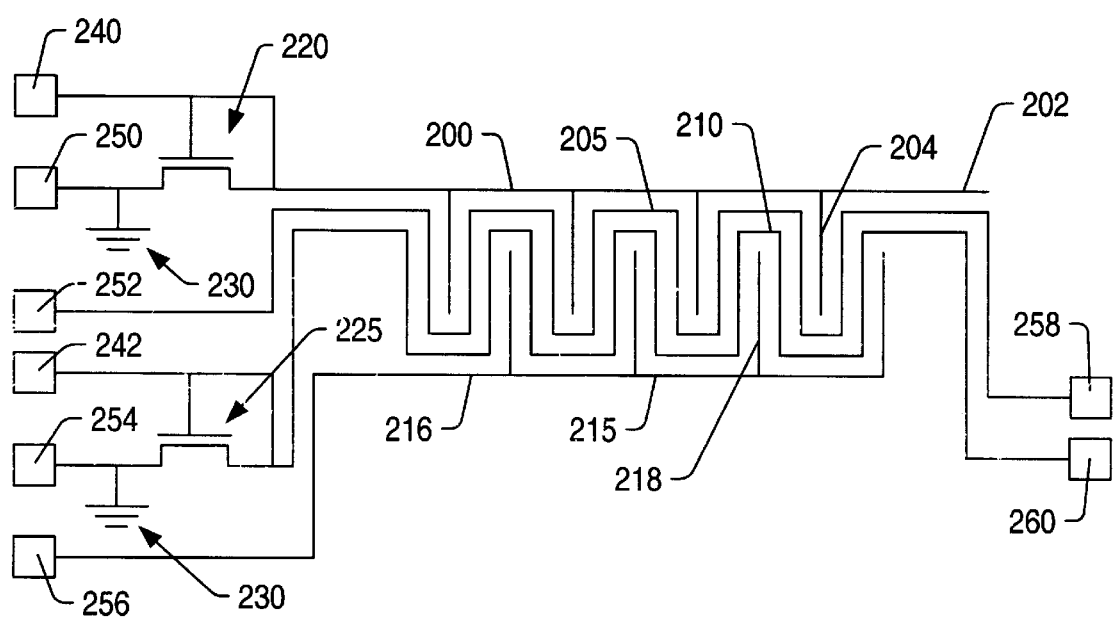
FIG. 6 depicts a schematic view of a test structure which includes four conductive lines.

In another embodiment, a test structure may include four conductive lines. A schematic diagram of a test structure which includes four conductive lines is depicted in FIG. 6. The first conductive line 200 is formed on an integrated circuit topography and coupled to ground 230. First conductive line 200 preferably includes a main portion 202 with projections 204 extending from the main portion. These projections 204 give first conductive line 200 a comb like appearance. First conductive line 200 is preferably coupled to a first transistor 220. First transistor 220 is preferably a depletion-mode MOSFET transistor. An n-channel depletion-mode MOSFET or a p-channel depletion-mode MOSFET may be used. The transistor is configured as described above. By applying a voltage to the gate of the transistor, first conductive line 200 may be disconnected from ground 230. By disconnecting first conductive line 200 from ground 230, the first conductive line will become a floating line. First transistor 220 may be coupled to pads 240 and 250. Pads 240 and 250 are configured to receive an electrical probe. An electrical probe may be used to apply a voltage to pad 240 which is sufficient to cause the transistor to disconnect the first conductive line from ground 230. Pad 250 may be used for grounded electrical testing of the first conductive line.

The second conductive line 205 is formed on the integrated circuit topography and is a non-grounded, i.e., floating line. Second conductive line 205 is preferably routed in a serpentine fashion around the projections 204 and along the main portion 202 of first conductive line 200, as well as around the projections 218 and main portion 216 of fourth conductive line 215. Second conductive line 205 may be positioned such that a distance between the first and second conductive lines is substantially constant along and between projections 204, as well as along a portion of main portion 202 of first conductive line 200. The spacing between the first and second conductive lines may increase at the ends of the lines to allow connection of the second conductive line to pads 252 and 258. Pads 252 and 258 are configured to receive an electrical probe. Pads 252 and 258 may be used for electrical testing of the conductive lines.

The third conductive line 210 is formed on the integrated circuit topography and coupled to ground 230. Third conductive line 210 is preferably routed in a serpentine fashion around the projections 204 and along the main portion 202 of first conductive line 200, as well as around the projections 218 and main portion 216 of the fourth conductive line 215. Third conductive line 210 may be positioned such that a distance between the first and third, and the fourth and third conductive lines, is substantially constant along and between the projections and main portions of the first and fourth conductive lines. A second depletion mode transistor 225 is preferably coupled to the third conductive line. An n-channel depletion-mode MOSFET or a p-channel depletion-mode MOSFET may be used. The transistor is preferably configured as described above. By applying a voltage to the gate of second transistor 225, third conductive line 210 may be disconnected from ground 230. By disconnecting third conductive line 210 from ground 230, the third conductive line will become a floating line. Second transistor 225 may be coupled to pads 242, 254 and 260. Pads 242, 254 and 260 are configured to receive an electrical probe. An electrical probe may be used to apply a voltage to pad 242 which is sufficient to cause the transistor to disconnect the third conductive line from ground 230. Pad 254 may be used for grounded electrical testing of the third conductive line.

The fourth conductive line is formed on the integrated circuit topography and is a non-grounded, i.e., floating line. Fourth conductive line 215 preferably includes a main portion 216 with projections 218 extending from the main portion. These projections 218 give fourth conductive line 215 a comb like appearance. Fourth conductive line is coupled to pad 256, which is configured to receive an electrical probe. Pad 256 may be used for electrical testing of the test structure.

After the test structure is formed, the test structure may be inspected using voltage contrast inspection. Preferably, the test structure is irradiated with electrons using a scanning electron microscope ("SEM"). By monitoring the pattern of electrons emitted by the test structure, the absence or presence of defects may be determined.

In the absence of a defect, the lines should have an alternating glowing-darkened pattern. The grounded first and third conductive lines, should appear dark, while the second and fourth floating lines should appear glowing. If a defect is present, however, the lines may not show the expected pattern. If an EMD is present in the test structure which causes first conductive line 200 and second conductive line 205 to become shorted, second conductive line 205 will become grounded and a portion of the line will appear darkened. Similarly, a defect which causes a short between the second and third conductive lines will also cause a portion of the second conductive line to become darkened.

A defect which causes a short to occur between the third and fourth lines may cause a portion of the fourth conductive line to become darkened. Defects may also be sufficient in size to span three or more conductive lines. If an EMD contacts the second conductive line and the fourth conductive lines portions of both the second and fourth conductive lines will become darkened due to grounding through the first and/or third conductive lines.

If an MMD is present along either the first or third conductive line, then only a portion of the first conductive line will be grounded. The other portion is now disconnected from ground. When the test structure is scanned using an SEM only the grounded portion of either the first conductive line 200 or the third conductive line 210 will appear dark. The floating portion of these lines will glow in a manner similar to second and fourth conductive lines.

Figure 7:
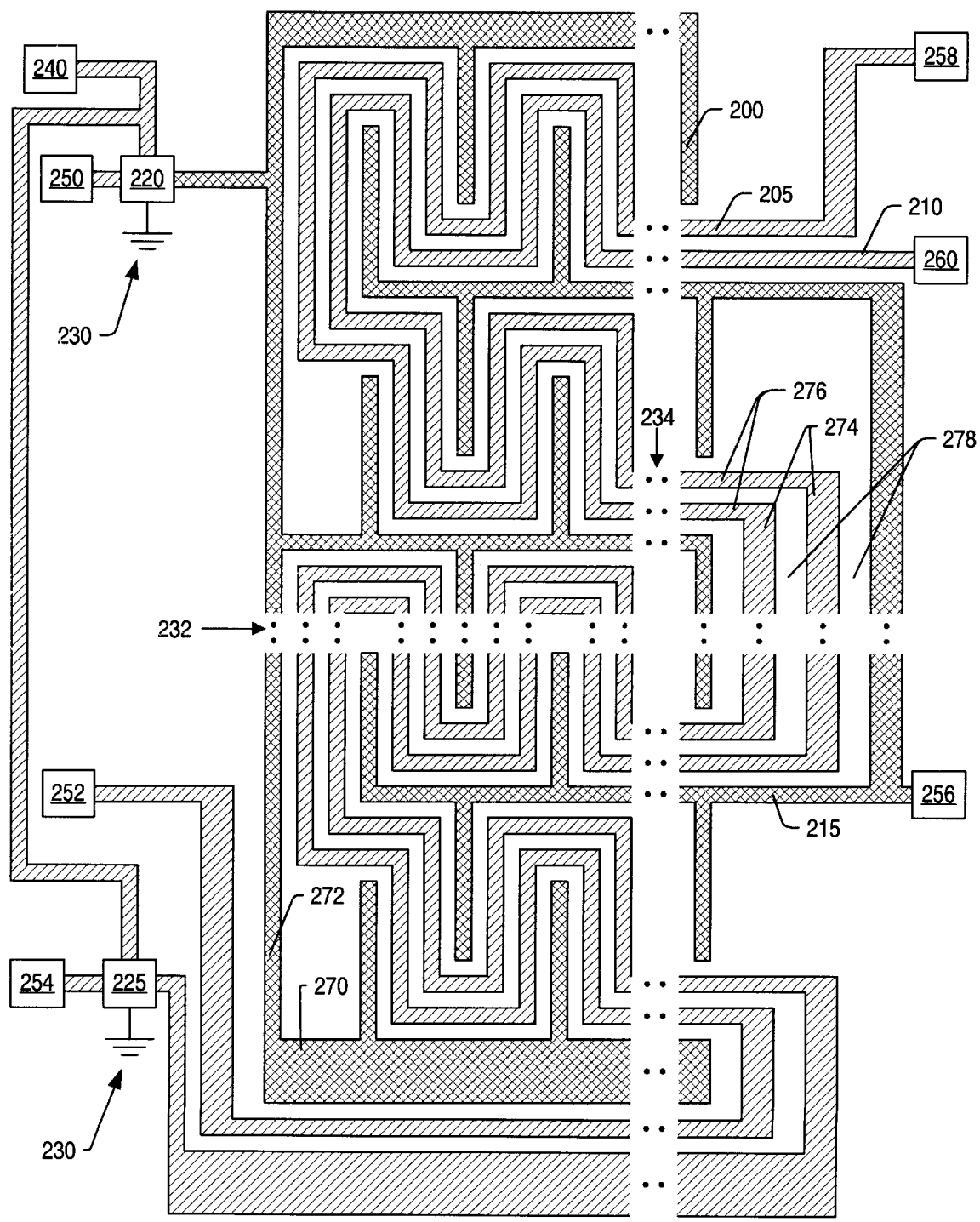
FIG. 7 depicts a top view of a test structure, formed on an integrated circuit topography, which includes four conductive lines.

Turning to FIG. 7, an overhead view of a test structure which includes four conductive lines is depicted. The conductive lines 200, 205, 210, and 215 of the test structure are preferably formed in a test region of an integrated circuit topography while conductive lines of the same material are being formed in a production region of the wafer. The size of the test structure may vary. It should be understood that the vertical and horizontal patterns depicted may be extended over the integrated circuit topography until a desired area of the topography is covered by the test structure. For example, the test structure may be extended along the vertical axis through region 232 and along the horizontal axis at region 234. The area of the test structure may vary from about 900 $\mu m^2$ to an area that covers the entire wafer. Typically, the area of the test structure is limited to the amount of space required for formation of the electrical testing pads. Preferably, the width of the conductive lines and the spacing between the lines is chosen to be the same as the conductive lines being formed in the production area of a wafer or during a production run.

First conductive line 200 is a comb like line as described above. First conductive line 200 is coupled to ground 230 via first transistor 220. First transistor 220 is coupled to pad 240, which is configured to receive an electrical probe. The first conductive line may be disconnected from ground 230 by applying a voltage to pad 240. The width of first conductive line 200 may vary. For example, portion 270 of first conductive line 200 may be formed having a significantly wider width than portion 272. This variation in width is preferably done to allow testing of the coupling of narrow conductive lines to wider conductive lines.

Second and third conductive lines are preferably formed to meander through the comb like projections of the first conductive line 200 and fourth conductive line 215. Second conductive line 205 is preferably a floating line. Third conductive line 210 is preferably coupled to ground 230 through second transistor 225. Second transistor 225 is preferably coupled to pad 240. Pad 240 may then be used to activate first transistor 220 and second transistor 225, allowing disconnection of the first and third conductive lines from ground using a single pad 240. The width of second and third conductive lines, 205 and 210, may also vary. For example, narrow portions 276 of second and third conductive lines may be coupled to wider portions 274 of these lines. Second and third conductive lines may also be coupled to test pads, 252, 258, and 260 to allow electrical testing of the conductive lines.

Fourth conductive line 215 is a comb like line as described above. Fourth conductive line is preferably a floating line. The width of fourth conductive line 215 may vary as described above for the other conductive lines. The spacing between the lines is substantially constant. However, the spacing may be increased at portions of the test structure. For example, in region 278 the spacing between the second and third conductive lines is increased. This increase in width will allow testing of the spacing of the conductive lines.

Figure 8:
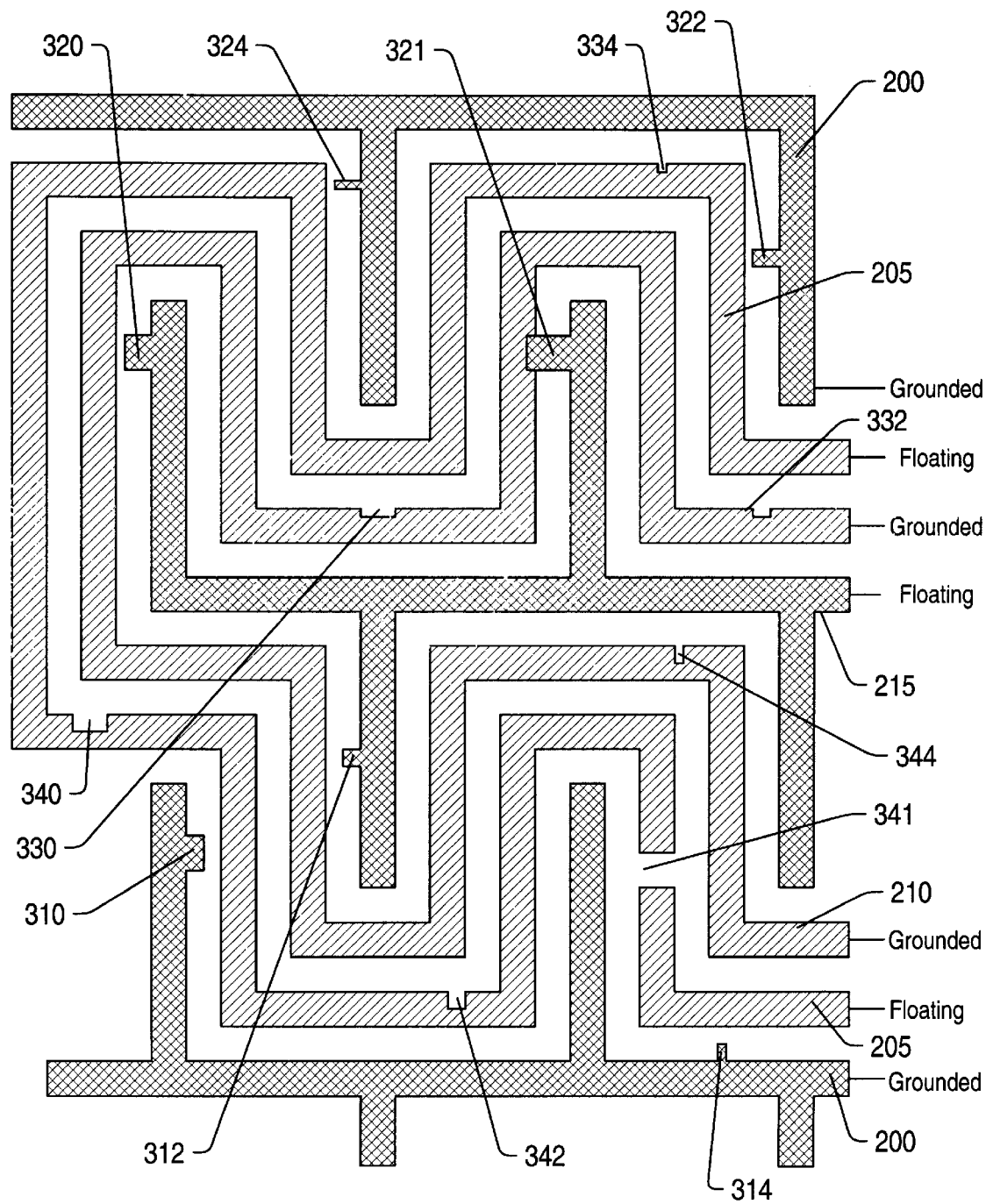
FIG. 8 depicts a top view of a test structure, formed on an integrated circuit topography, which includes partial MMDs and partial EMDs.

In another embodiment, intentional partial defects and full defects may be incorporated into portions of the test structure. FIG. 8 depicts an overhead view of a portion of the test structure depicted in FIG. 7 which includes intentional partial defects. The test structure includes four conductive lines, 200, 205, 210 and 215 as described above. Partial EMDs are preferably formed on first conductive line 200 and fourth conductive line 215. Partial MMDs are preferably formed on second conductive line 205 and third conductive line 210.

Partial EMDs preferably extend from the first and fourth conductive lines toward the second and third conductive lines, respectfully. The partial EMDs extend across up to 80% of the gap between the conductive lines. Partial EMDs 310, 312, and 314 extend from the first conductive line 200 toward the second conductive line 205, bridging approximately 50% of the gap between the two conductive lines. The width of the partial EMDs is preferably varied, such that defect 310 has a width approximately equal to the width of the conductive line from which it extends. Defect 312 has a width which is approximately 50% of the width of the conductive line from which it extends. Defect 314 has a width which is approximately 20% of the width of the conductive line from which it extends. Defects having a variety of widths are produced to mimic the possible types of defects which may occur during processing. Other partial EMDs 320, 322, and 324 may be formed such that they extend from the first conductive line toward the second conductive line 205, bridging approximately 80% of the gap between the two conductive lines. The widths of these defects may also be varied such that defects 320, 322, and 324 have width which are 100%, 50% and 20%, respectively, of the width of the first conductive line. Intentional full EMDs may also be formed. A full EMD 321 is a defect which bridges adjacent conductive lines. Preferably, only one full EMD 321 is formed.

Preferably a number of partial EMDs are produced throughout a test region of a integrated circuit topography. The number of partial EMDs produced may be dependent on the width of the partial EMD. For example, the wider partial EMDs (e.g., 310 and 320) are typically easier to produce than the much narrower defects (e.g., 314 and 324). Therefore, to accurately assess the effect of partial defects on the formation of conductive features, it is preferable that more of the narrow partial EMDs be produced than of the wide partial EMDs. On a test structure which has a dimension of about 30 $\mu$m by 30 $\mu$m, the following types and quantities of intentional defects may be produced: at least 3 partial EMDs having a width substantially equal to the conductive line width; 9 partial EMDs having a width of about 50% of the conductive line width; and 18 partial EMDs having a width of about 20% of the conductive line width.

Partial MMDs preferably partially extend through a portion of the second or third conductive lines. The partial MMDs may extend through up to 50% of the conductive lines. Partial MMDs 330, 332, and 334 partially extend through second conductive line 205 forming a slot such that about 20% of the conductive material is missing. The widths of the partial MMDs are preferably varied, such that defect 330 has a width approximately equal to the width of the conductive line in which it is formed. Defect 332 has a width which is approximately 50% of the width of the conductive line in which it is formed. Defect 334 has a width which is approximately 20% of the width of the conductive line in which it is formed. Other partial EMDs 340, 342, and 344 may be formed such that they partially extend through third conductive line 210 forming a slot such that about 50% of the conductive material is missing. The widths of these partial MMDs may also be varied such that defects 340, 342, and 344 have width which are 100%, 50% and 20%, respectively, of the width of the third conductive line. Intentional full MMDs may also be formed. A full MMD 341 is a defect which extends through the entire conductive line. Preferably, only one full MMD 341 is formed.

Preferably a number of partial MMDs are produced throughout a test region of a integrated circuit topography. The number of partial MMDs produced may also be dependent on the width of the partial MMD. Similar to the partial extra material defects, the wider partial MMDs (e.g., 330 and 340) are typically easier to produce than the much narrower defects (e.g., 334 and 344). On a test structure which has a dimension of about 30 $\mu$m by 30 $\mu$m, the following types and quantities of intentional defects may be produced: at least 3 partial MMDs having a width substantially equal to the conductive line width; 9 partial MMDs having a width of about 50% of the conductive line width; and 18 partial MMDs having a width of about 20% of the conductive line width. Preferably, each of the partial defects formed in the test structure are separated from each other by a distance of about 30 $\mu$m. In this manner each partial defect may be independently accessed when using a testing region having a diameter of about 30 $\mu$m.

Preferably, the above-described intentional defects are produced at predetermined locations about the test structure. By knowing the location of these intentional defects, the test structure may be rapidly inspected to determine the location of intentional partial defects which have become full defects during production of the test structure. The test structure may be scanned using a voltage contrast scanning method or optical inspection. After a defect has been detected, an optical scan of the regions of the test structure may be performed to determine what type of intentional partial defects produce full defects in a test structure. In this manner, a test structure, with intentional defects, may more accurately determine the type of particles which cause full defects on a production wafer.

Another advantage of forming partial defects at known locations within the test structure is that the ability of an inspection tool to detect small and/or low contrast defects may be determined. Small defects are defects which are difficult to observe using standard voltage contrast inspections and/or optical inspections. Low contrast defects are defects which may cause changes which are hard to detect due to very low contrast between the defect and the non-defective conductive line. Both small defects and low contrast defects may be difficult to observe during voltage contrast and/or optical inspections. Thus, the defects may be missed. By producing known partial defects within a test structure the ability of an inspection tool to find the partial defects may be determined. For example, a number of partial defects may be formed in a first test structure. A second test structure may be formed having no intentional defects. The test structures may now be inspected using an inspection tool. If the inspection tool can detect these partial defects, differences between the first and second test structures should be noted. If however, the inspection tool is incapable of recognizing some or all of the partial defects, then the less, or no, differences between the first and second test structures will be noted. Thus, the test structure allows for the validation of a particular inspection tool and methodology.

It will be appreciated to those skilled in the art having the benefit of this disclosure that both the test structure and the method for using a test structure described herein are capable of applications with numerous types of conductive lines formed on an integrated circuit topography. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claim be interpreted to embrace all such modifications and changes and, accordingly the specification and drawings are to be regarded in an illustrative rather than a restrictive sense.

What is claimed is:

1. A test structure for accessing the ability of an inspection tool to find defects in conductive features formed on an integrated circuit topography comprising:
   a first conductive line formed from a conductive material upon the integrated circuit topography;
   a second conductive line formed from the conductive material upon the integrated circuit topography, wherein the second conductive line is separated by the first conductive line by a gap devoid of the conductive material;
   at least one partial extra material defect extending from a predetermined location on the first conductive line toward the second conductive line, wherein the partial extra material defect extends partially across the gap; and
   at least one partial missing material defect partially extending across a predetermined location of the second conductive line such that a slot is formed in the second conductive line.

2. The test structure of claim 1, wherein the first conductive line is coupled to ground, and wherein the second conductive line is substantially ungrounded.

3. The test structure of claim 2, further comprising a transistor coupled to the first conductive line, wherein the transistor is configured to couple the first conductive line to ground, and wherein the transistor is configured to disconnect the first conductive line from the ground when a voltage is applied to the transistor.

4. The test structure of claim 3, further comprising a pad coupled to the transistor, wherein the pad is configured to receive an electrical testing probe, and wherein applying the voltage to the pad causes the transistor to disconnect the first conductive line from the ground.

5. The test structure of claim 1, wherein the first conductive line comprises a main portion and projections extending from the main portion, and wherein the second conductive line substantially surrounds the projections such that a distance between the second line and the first line is substantially constant.

6. The test structure of claim 1 further comprising:
   a third conductive line formed from the conductive material upon the integrated circuit topography;
   a substantially ungrounded fourth conductive line formed from the conductive material upon the integrated circuit topography, wherein the fourth conductive line is separated from the third conductive line by a gap devoid of the conductive material;
   an additional partial extra material defect extending from a predetermined location on the fourth conductive line toward the third conductive line, wherein the partial extra material defect extends partially across a gap between the third and fourth conductive lines; and
   an additional partial missing material defect partially extending across a predetermined location of the third conductive line such that a slot is formed in the third conductive line.

7. The test structure of claim 6, wherein the first and third conductive lines are coupled to ground, and wherein the second and fourth conductive lines are substantially ungrounded.

8. The test structure of claim 7, further comprising a first transistor coupled to the first conductive line and a second transistor coupled to the third conductive line, wherein the first transistor is configured to couple the first conductive line to ground, and wherein the first transistor is configured to disconnect the first conductive line from the ground when a voltage is applied to the first transistor, and wherein the second transistor is configured to couple the third conductive line to ground, and wherein the second transistor is configured to disconnect the third conductive line from the ground when a voltage is applied to the second transistor.

9. The test structure of claim 1, wherein the partial extra material defect extends across up to 80% of the gap.

10. The test structure of claim 1, wherein the partial missing material defect forms a slot extending across up to 50% of the second conductive line.

11. The test structure of claim 1, wherein the partial extra material defect has a width between about 20% of the width of the first conductive line to about 100% of the width of the first conductive line, and wherein the partial missing material defect has a width between about 20% of the width of the first conductive line to about 100% of the width of the first conductive line.

12. A method for testing the tolerance of an inspection tool for determining defects in conductive features formed on an integrated circuit topography comprising:
   forming a test structure on the integrated circuit topography, the test structure comprising:
      a first conductive line formed from a conductive material upon the integrated circuit topography;
      a second conductive line formed from the conductive material upon the integrated circuit topography, wherein the second conductive line is separated by the first conductive line by a gap devoid of the conductive material;
      at least one partial extra material defect extending from a predetermined location on the first conductive line toward the second conductive line, wherein the partial extra material defect extends partially across the gap; and
      at least one partial missing material defect partially extending across a predetermined location of the second conductive lines such that a slot is formed in the second conductive line;
   irradiating the test structure with electrons;
   inspecting the test structure while the test structure is irradiated with electrons; and
   optically inspecting the predetermined locations on the first and second conductive lines.

13. The method of claim 12, wherein the first conductive line is coupled to ground, and wherein the second conductive line is substantially ungrounded.

14. The method of claim 13, wherein the test structure further comprises a transistor coupled to the first conductive line, wherein the transistor is configured to couple the first conductive line to ground, and wherein the transistor is configured to disconnect the first conductive line from the ground when a voltage is applied to the transistor.

15. The method of claim 12, wherein the partial extra material defect extends across up to 80% of the gap.

16. The method of claim 12, wherein the partial missing material defect forms a slot extending across up to 50% of the second conductive line.

17. The method of claim 14, further comprising:

applying a voltage to the transistor such that the first conductive line is disconnected from ground;

electrically testing for the presence of an extra material defect between the first and second conductive lines; and electrically testing for the presence of a missing material defect along the first and second conductive lines.

18. The method of claim 12, wherein the test structure further comprises:

a third conductive line formed from the conductive material upon the integrated circuit topography;

a fourth conductive line formed from the conductive material upon the integrated circuit topography, wherein the fourth conductive line is separated from the third conductive line by a gap devoid of the conductive material;

an additional partial extra material defect extending from a predetermined location on the fourth conductive line toward the third conductive line, wherein the partial extra material defect extends partially across a gap between the third and fourth conductive lines; and an additional missing material defect partially extending across a predetermined location of the third conductive line such that a slot is formed in the third conductive line.

19. The method of claim 18, wherein the first and third conductive lines are coupled to ground, and wherein the second and fourth conductive lines are substantially ungrounded.

20. The method of claim 19, further comprising a first transistor coupled to the first conductive line and a second transistor coupled to the third conductive line, wherein the first transistor is configured to couple the first conductive line to ground, and wherein the first transistor is configured to disconnect the first conductive line from the ground when a voltage is applied to the first transistor, and wherein the second transistor is configured to couple the third conductive line to ground, and wherein the second transistor is configured to disconnect the third conductive line from the ground when a voltage is applied to the second transistor.

* * * * *